United States Patent
Pelissier et al.

(10) Patent No.: US 10,868,701 B2
(45) Date of Patent: Dec. 15, 2020

(54) METHOD FOR BANDPASS SAMPLING BY POSITION MODULATED WAVELETS

(71) Applicant: Commissariat A L'Energie Atomique et aux Energies Alternatives, Paris (FR)

(72) Inventors: Michael Pelissier, Grenoble (FR); Marguerite Marnat, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/699,356

(22) Filed: Nov. 29, 2019

(65) Prior Publication Data
US 2020/0220751 A1 Jul. 9, 2020

(30) Foreign Application Priority Data

Jan. 9, 2019 (FR) ...................... 19 00181

(51) Int. Cl.
*H03M 1/12* (2006.01)
*H04L 27/00* (2006.01)
(Continued)

(52) U.S. Cl.
CPC ...... *H04L 27/0004* (2013.01); *H04L 25/4902* (2013.01); *H04L 27/12* (2013.01); *H03M 1/124* (2013.01)

(58) Field of Classification Search
CPC . H04L 27/0004; H04L 25/4902; H04L 27/12; H03M 1/124
See application file for complete search history.

(56) References Cited

U.S. PATENT DOCUMENTS 8,725,784 B2 * 5/2014 Davenport .............. H03M 7/30
708/300
9,450,597 B1 * 9/2016 Ahmed ............... H03M 1/1245
(Continued)

FOREIGN PATENT DOCUMENTS

EP 3 319 236 A1 5/2018

OTHER PUBLICATIONS

French Preliminary Search Report dated Oct. 3, 2019 in French Application 19 00181 filed on Jan. 9, 2019 (with English Translation of Categories of Cited Documents), 3 pages.
(Continued)

*Primary Examiner* — Dac V Ha
(74) *Attorney, Agent, or Firm* — Oblon, McClelland, Maier & Neustadt, L.L.P.

(57) ABSTRACT

The present invention relates to a wavelet bandpass sampling method, with low aliasing and a corresponding device. The analogue signal to sample is correlated with a sequence of wavelets succeeding each other with a rate $f_p$ of which the positions in the sequence are temporally modulated from arguments of a CAZAC sequence, notably a Zadoff-Chu sequence. The correlation results are next sampled at a frequency $f_s \leq f_p$ and digitally converted to provide a compressed representation of the signal. The temporal modulation of the positions of the wavelets makes it possible to obtain incoherent aliasing of the correlation signal in the sampling band and thereby to reduce aliasing.

14 Claims, 11 Drawing Sheets

(51) Int. Cl.
*H04L 25/49* (2006.01)
*H04L 27/12* (2006.01)

(56) References Cited

U.S. PATENT DOCUMENTS

2004/0071244 A1* 4/2004 Shaeffer ................. H03H 15/00
375/350
2010/0241378 A1* 9/2010 Baraniuk .............. H03L 7/0805
702/66

OTHER PUBLICATIONS

Marnat, M., "Radiofrequency receivers based on compressive sampling for feature extraction in cognitive radio applications", HAL archives-ouvertes.fr, HAL ID: tel-02006664 https://hal.archives-ouvertes.fr/tel-02006664, 2018, 151 pages.
Anonymous, "Constant amplitude zero autocorrelation waveform", Wikipedia, 2016, 1 page.
Pelissier, M., et al., "Non-uniform wavelet sampling for RF analog-to-information conversion", IEEE Transactions on Circuits and Systems I: Regular Papers, 2017, pp. 1-14.
Li, K., et al., "Convolutional compressed Sensing Using Deterministic Sequences", IEEE Transactions on Signal Processing, vol. 61, No. 3, 2013, pp. 740-752.

* cited by examiner

METHOD FOR BANDPASS SAMPLING BY POSITION MODULATED WAVELETS

TECHNICAL FIELD

The present invention relates, generally speaking, to the field of compressive sensing and more specifically that of bandpass sub-sampling associated with a projection of the signal on wavelets, also known as WBS (wavelet bandpass sampling).

PRIOR ART

One of the promising techniques for addressing the considerable increase in the amount of data generated by networks of sensors is compressive sensing or CS, also known as compressed sampling or sparse sampling.

Compressive sensing is based on the following theoretical foundation: a signal that has spectral parsimony criteria in a given band, that is to say of which the information is not contained in the whole of the band in question, may be sampled without loss providing that its sampling frequency is close to the Landau frequency, that is to say its actual information band.

It will firstly be recalled that, as a general rule, the sampling of a signal at a frequency below the Nyquist frequency, $f_{Nyq}=2 f_{max}$, where $f_{max}$ is the highest frequency present in the spectrum of the signal, leads to spectral aliasing and thus an impossibility of reconstructing the initial signal. When the signal is sampled at the Nyquist frequency over a given sensing interval (of time or space), $T_{acq}$, it may be represented by a vector x of size $N=f_{Nyq} \cdot T_{acq}$, in the canonical base (instants of this time interval or points of this spatial interval) of this domain.

However, when the representation of the signal is K-sparse in a given dual domain (generally the frequency domain), that is to say if this signal is represented by K non-zero components in a base of this domain (generally a Fourier base), this signal may be reconstructed from M measurements linearly depending on these components, where M is of the order of K log N. More precisely, if y denotes the vector of which the elements are these M linear measurements, it may be expressed in the following manner:

$$y=\Phi x=\Phi \Psi s \quad (1)$$

where s is the K-sparse representation in a base of the dual domain, $\Psi$ is a transformation matrix (or sparsity matrix) of size N×N making it possible to go from the base of the dual domain to the canonical base and $\Phi$ is the measurement matrix (or sensing matrix) of size M×N, with M<<N thereby showing the dimensionality reduction. The matrix $\Phi$ may be written in the form $\Phi=R_T I_N$ where $R_T$ represents a random selection of M lines among N of the identify matrix $I_N$, in other words the random selection of M samples among N.

Different compressive sensing methods have been envisaged. The first is that of non-uniform sampling (NUS). According to this method, the signal is sampled at irregular intervals by only selecting certain samples at the output of a conventional sampler at the Nyquist frequency. However, this method requires using a sampler at the Nyquist frequency, or even several samplers in parallel at a lower sampling frequency but requiring a synchronisation clock at the Nyquist frequency. Moreover, the non-uniform sampler remains very sensitive to clock jitter. Finally, despite the reduction in the average rate of the samples, the fact remains that the analogue passband of the sampler must be important so as not to filter the signal. This can prove to be problematic in terms of realisation in a very wide applicative context which can go up to one hundred or so GHz.

When the signal to sample is a multi-band RF signal, it is preferred to use a more suitable sensing method, namely a bandpass sub-sampling, also called Non-Uniform Wavelet Bandpass Sampling (NUWBS). This uses a dictionary of elementary functions forming a base, or even a generating family (overcomplete) of $L^2(\mathbb{R})$, designated hereafter wavelets, of which the central frequencies are respectively situated in the sub-bands of the RF signal.

This signal is correlated with a sequence of wavelets succeeding each other at the rate $$f_s = \frac{f_{Nyq}}{\gamma} \ll f_{Nyq},$$

where $\gamma$ is a sub-sampling factor defined hereafter. Only certain results at the output of the correlator (supplied every $T_s=1/f_s$) are retained at the output of the correlator.

In this case, using the same formalism as previously:

$$y=R_T W^H F^{-1} s=R_T A s \quad (2)$$

with $A=W^H F^{-1}=(FW)^H$ where F is the matrix representing the discrete Fourier transform ($F^H=F^{-1}$) of size N, and W is a matrix of size N×N$_s$ of which each of the columns (and thus each of the lines of $W^H$) represents a wavelet in the canonical base and each of the lines represents a sampling time and where $R_T$ is a selection matrix of M lines among $N_s$ of the sensing matrix A. Similarly, each line of the matrix A corresponds to an element of the dictionary and each column to a sampling time. The matrix A represents the Hermitian conjugate of the Fourier transform of each of the wavelets.

A detailed description of the NUWBS sensing method will be found in the application EP-A-3319236 and in the article of M. Pelissier et al. entitled "Non-uniform wavelet sampling for RF analog-to-information conversion", IEEE Transactions on Circuits and Systems I, August 2017.

The particularity of the NUWBS method resides in the fact of being able to generate wavelets and to carry out the correlation thereof with the RF signal in an analogue manner. The correlation results are supplied by the correlator at the rate $f_s$ and these results are sampled in a non-uniform manner. The NUWBS method is advantageous in the sense where the correlation with the wavelet is done analogously, before sampling, which makes it possible to reduce drastically the constraints of the analogue/digital converter in terms of passband and sampling rate.

The sub-sampling factor $\gamma$ depends on the aggregated width, $B_{agg}^w$, of the $N_b$ sub-bands of the RF signal, i.e.:

$$\gamma = \frac{f_{Nyq}}{B_{agg}^w} = \frac{f_{Nyq}}{\sum_{i=1}^{N_b} B_i^w} \quad (3)$$

where $B_i^w$, $i=1, \ldots, N_b$ are the widths of the sub-bands of the RF signal. The fact that only certain samples (that is to say correlation results) can be retained at the output of the correlator (non-uniform sampling) stems from the fact that some of the bands may be lacunary and thus that the Landau frequency is less than $f_s$. However, when these sub-bands are entirely occupied, a uniform sampling of all the results at the rate $f_s$ will suffice.

The elementary functions used for the decomposition in dual space are for example Gabor functions or Morlet wavelets. Wavelets designate herein functions of which the temporal support is bound and of which the central frequency is adjustable.

Gabor functions are defined in the time domain by:

$$\psi_{f_v^c,\delta_k}(t) = \left(\frac{2}{\pi}\right)^{\frac{1}{4}} \frac{1}{\sqrt{\tau}} e^{2\pi i f_v^c(t-\delta_k)} e^{-\left(\frac{t-\delta_k}{\tau}\right)^2} \quad (4)$$

It will thus be understood that a Gabor function $\psi_{f_v^c,\delta_k}(t)$ is defined on a width bound temporal support, centred on the instant $\delta_k$ and of central frequency $f_v^c$.

The dictionary used is then composed of the family $\{\psi_{jb,ka}(t)\}$ where a is a time discretisation interval and b a frequency discretisation interval. Typically a is equal to 1/fNYQ or equal to 1/Ts in the case of a wavelet bandpass sub-sampling system.

FIG. 1 schematically represents a NUWBS sampling method known from the prior art.

In the upper part of the figure is represented a sequence of wavelets succeeding each other at the rate $f_p=1/T_p$, noted p(t), generated by the analogue generator 120. This sequence is multiplied (Hermitian scalar product) with the RF signal, x(t), the Hermitian product being integrated in 130 over an interval of duration $T_i(T_i \leq T_p)$. The correlation results at the output of the integrator 130 are sampled at the frequency $f_p$ then decimated in a non-uniform manner by a decimation factor $N_s/M$ in the ADC converter, 150, to obtain a sequence of samples representative of the RF signal at the average rate $f_s=M/T_{acq}$ which may be made as close as desired to the Landau frequency. Alternatives of this NUWBS sampler with several correlation and sampling branches have also been described in the aforesaid patent EP-A-3319236.

Whatever the envisaged alternative, the NUWBS sampler makes it possible to obtain compression rates close to the theoretical Landau value. However, in a similar manner to what occurs in conventional bandpass sub-sampling, spectral aliasing arises on account of the sub-sampling with respect to the Nyquist frequency.

To illustrate the effect of spectral aliasing in a non-uniform WBS (NUWBS), or even uniform (UWBS), sampler, that is to say corresponding to the case where the decimation factor is equal to 1, one will be in the case where all the wavelets have the same central frequency and only differ by their time shifts. $\psi(t)$ denotes the waveform common to these wavelets and $$p(t) = \psi(t) \otimes \sum_{k=0}^{\infty} \delta(t - T_p)$$

the sequence of wavelets here assumed infinite.

In this case, the signal at the output of the correlator may be represented in the spectral domain by:

$$Y(f) = X(f) \otimes H^*(-f) \quad (5)$$

with:

$$H(f) = \sum_{k=0}^{\infty} H_k(f) = \sum_{k=0}^{\infty} \Psi(kf_p)\delta(f - kf_p) \quad (6)$$

where X(f) and Y(f) are the respective spectra of x(t) and y(t), and where $\Psi(f)$ and H(f) are respectively the spectra of $\psi(t)$ and of p(t).

If one considers henceforth two spectral components of X(f) situated at the frequencies $f_L=f_{BB}+nf_p$ and $f_U=f_{BB}+(n+1)f_p$ with $-f_p/2<f_{BB}\leq f_p/2$ and if one assumes that the correlation results are sampled at the frequency $f_s=f_p$ (that is to say that a uniform sampling is carried out without decimation), these two components will be aliased on the same frequency $f_{BB}$ after sampling, since:

$$Y(z = e^{j2\pi f T_p}) = \sum_{k=0}^{\kappa-1} Y\left(e^{j2\pi T_{Nyq}\left(\frac{f-kf_p}{\kappa}\right)}\right) \quad (7)$$

with $\kappa = \frac{f_{Nyq}}{f_s} = \frac{f_{Nyq}}{f_p}$, since $f_U - (k+1)f_p = f_L - kf_p$.

FIG. 2 represents the spectrum of the sequence of wavelets, H(f), in the Nyquist band of the input signal, x(t). The spectrum H(f) is centred on a sub-band of the RF signal, of width $BW_{RF}$. Also represented in the figure is the Nyquist frequency, $f_{Nyq}$ of the signal x(t) as well as the sampling frequency at the output of the correlator, i.e. here $f_s=f_p$.

The convolution of the line spectrum H(f) with that of the signal in the sub-band, then the spectral aliasing in the interval $$\left[-\frac{f_p}{2}, +\frac{f_p}{2}\right]$$

leads to distinguishing two spectral zones: a first zone, 210, corresponding substantially to the sub-band, giving rise to aliasing of intraband type and a second zone, 220, outside of this spectral envelope not making a contribution to the spectrum of the sampled signal. More precisely, a spectral component at $f_{in}$ of the sub-band gives, after convolution with H(f), the same spectrum H(f) centred on the frequency $f_c-f_{in}=f_{BB}\text{mod}\cdot f_p$ where $f_c$ is the central frequency of the wavelet. After sampling at $f_p$, the components $H(f_{BB}+mf_p)$ are all aliased on the frequency $f_{BB}$. On the other hand, a frequency $f_{out}$ situated outside of the sub-band gives, after convolution with H(f), a zero value and thus does not make a contribution to the spectrum of the sampled signal.

It will be noticed that, on account of the filtering by $\Psi(f)$, the number of lines in the spectral envelope of H(f) is limited (by a factor equal to the ratio between the width of the spectral envelope of the wavelet and the repetition frequency $f_p$) and most of them are of low power. Aliasing is reduced compared to conventional spectral band sampling (that is to say, without correlation with wavelets and thus in which all the lines contribute, $\Psi(f)=1$) but remain nevertheless present, notably when wavelets of brief duration with regard to their repetition period are used. This aliasing leads to a loss of information linked to the ambiguity of the aliased spectral rays and consequently to a distortion of the signal reconstructed from the train of samples.

The aim of the present invention is to propose a wavelet bandpass sampling method, uniform or non-uniform, only having reduced aliasing, and consequently enabling very good reconstruction of the signal from the train of samples. Another aim of the present invention is to propose a simple implementation of this sampling method.

DESCRIPTION OF THE INVENTION

The present invention is defined by a method for bandpass sampling of an analogue signal, the spectrum of said signal having a set of sub-bands, said signal being correlated with a sequence of wavelets succeeding each other with a rate $f_p$ equal to the sum of the widths of said sub-bands, the central frequencies of the wavelets belonging to said sub-bands, in which the respective positions of the wavelets in the sequence are temporally modulated by means of arguments of successive elements of a CAZAC sequence, the correlation results with the sequence of wavelets thereby position modulated being sampled with a frequency $f_s \leq f_p$ and digitally converted.

The sequence of wavelets is typically formed of a plurality of base sequences, each base sequence being of duration $\Sigma T_p$ with $T_p = 1/f_p$, the CAZAC sequence being of length $\Sigma$, the respective positions of the wavelets in a base sequence being temporally modulated by means of arguments of successive elements of the CAZAC sequence.

More precisely, the CAZAC sequence is formed by the complex elements $\eta_k$, $k=1, \ldots, \Sigma$ where the temporal positions of the wavelets of the sequence are the instants $kT_p + \varepsilon_k$ with $T_p = 1/f_p$ and $$\varepsilon_k = \frac{\arg(\varepsilon_k)}{2\pi f_c^v},$$

where $f_c^v$ is the central frequency of the wavelets.

In a preferred embodiment, the CAZAC sequence is a Zadoff-Chu sequence of which the elements are defined by:
$ZC_R(k) = e^{-j\pi Rk(k-1)/\Sigma}$, if the length $\Sigma$ of the sequence is odd, and $ZC_R(k) = e^{-j\pi R(k-1)(k-1)/\Sigma}$, if the length $\Sigma$ of the sequence is even and where R,$\Sigma$ are positive integers that are coprime, R representing the excursion of the instantaneous frequency, expressed as a multiple of $f_p$, along the sequence and $k \in [1, \Sigma]$.

The sequence of wavelets may be formed of at least a first and a second base sequence, the first base sequence being constituted of wavelets of which the positions are temporally modulated by means of arguments of successive elements of a first CAZAC sequence and the second base sequence being constituted of wavelets of which the positions are temporally modulated by means of arguments of successive elements of a second CAZAC sequence, the first and second CAZAC sequences being of same length but of distinct excursions of instantaneous frequency.

The spectrum of the analogue signal may include a first and a second sub-band, the sequence of wavelets then being formed of at least a first and a second base sequence, the first being constituted of wavelets of which the central frequency belongs to the first sub-band and the second being constituted of wavelets of which the central frequency belongs to the second sub-band.

The wavelets may be Gabor functions or Morlet wavelets.

The invention is also defined by a device for bandpass sampling of an analogue signal by passband sampling, the spectrum of said signal having a set of sub-bands, the device including at least one sampling branch comprising:

a wavelet sequence generator, the wavelets of said sequence succeeding each other with a rate $f_p$ equal to the sum of the widths of said sub-bands;

a correlator to correlate the analogue signal with said sequence of wavelets and to provide correlation results at the rate $f_p$;
a sampler for sampling the correlation results at the rate $f_p$;
an analogue digital converter to decimate and digitally convert the correlation results thereby sampled;
the sampling device further including:
a temporal position modulator intended to modulate the temporal positions of the wavelets of the sequence of wavelets generated by the generator, before correlation with the analogue signal, the temporal modulation being carried out by means of arguments of successive elements of a CAZAC sequence.

According to a preferred embodiment, the CAZAC sequence is a Zadoff-Chu sequence of which the elements are defined by:
$ZC_R(k) = e^{-j\pi Rk(k-1)/\Sigma}$, if the length $\Sigma$ of the sequence is odd, and $ZC_R(k) = e^{-j\pi R(k-1)(k-1)/\Sigma}$, if the length $\Sigma$ of the sequence is even and where R,$\Sigma$ are positive integers that are coprime, R representing the excursion of the instantaneous frequency, expressed as a multiple of $f_p$, along the sequence and $k \in [1, \Sigma]$.

According to an advantageous exemplary embodiment, the wavelet sequence generator includes a VCO oscillator switched by a switching signal, the VCO oscillator including:

an oscillating circuit of which the frequency is controlled to be equal to the central frequency of the wavelets of the sequence;
a pair of crossed transistors, mounted between the terminals of the oscillating circuit;
a common current source, the current source being switched by the switching signal;
a clock generator for generating a clock signal at the frequency $f_p$;
a frequency modulator for linearly modulating the frequency of the clock signal in such a way that it varies linearly from the start to the end of the sequence of wavelets with an excursion of $Rf_p$.

The wavelet sequence generator may further include a pulse shaping module, transforming each pulse of the clock signal into a pulse having the waveform of a wavelet.

The wavelets may be Gabor functions or Morlet wavelets.

BRIEF DESCRIPTION OF THE DRAWINGS

Other characteristics and advantages of the invention will become clear on reading a preferential embodiment of the invention, described with reference to the appended figures, among which.

DETAILED DESCRIPTION OF PARTICULAR EMBODIMENTS

Figure 1:
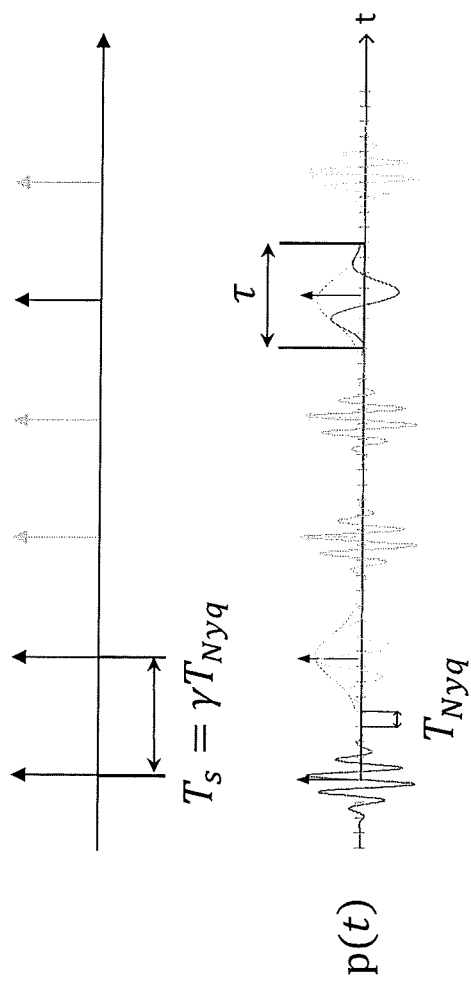
FIG. 1, already described, schematically represents a sampler using a WBS sampling method known from the prior art.
Figure 1:
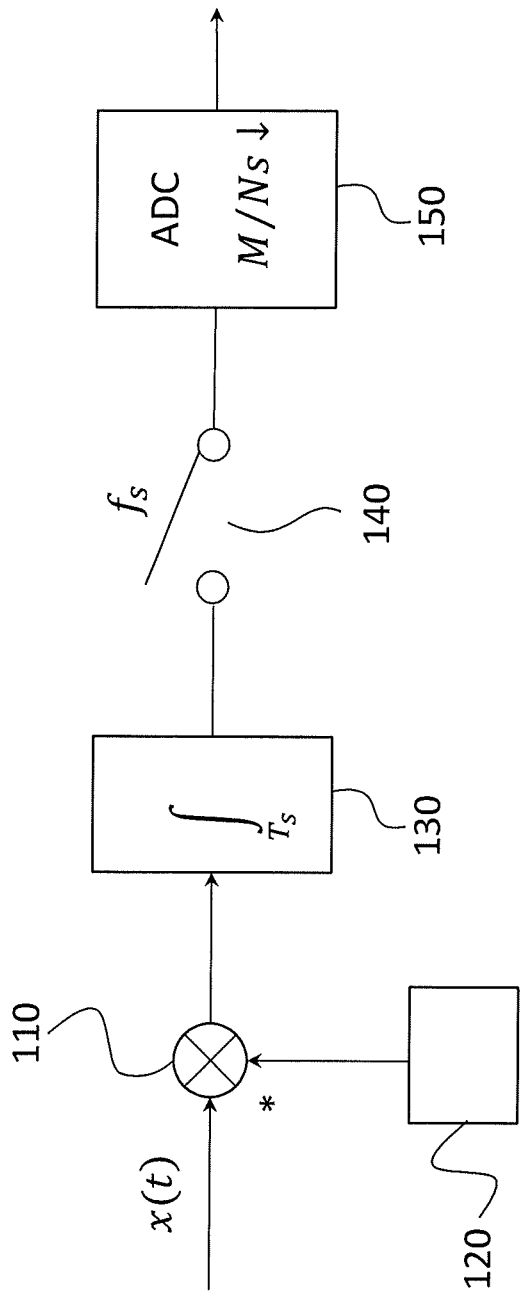
Figure 2:
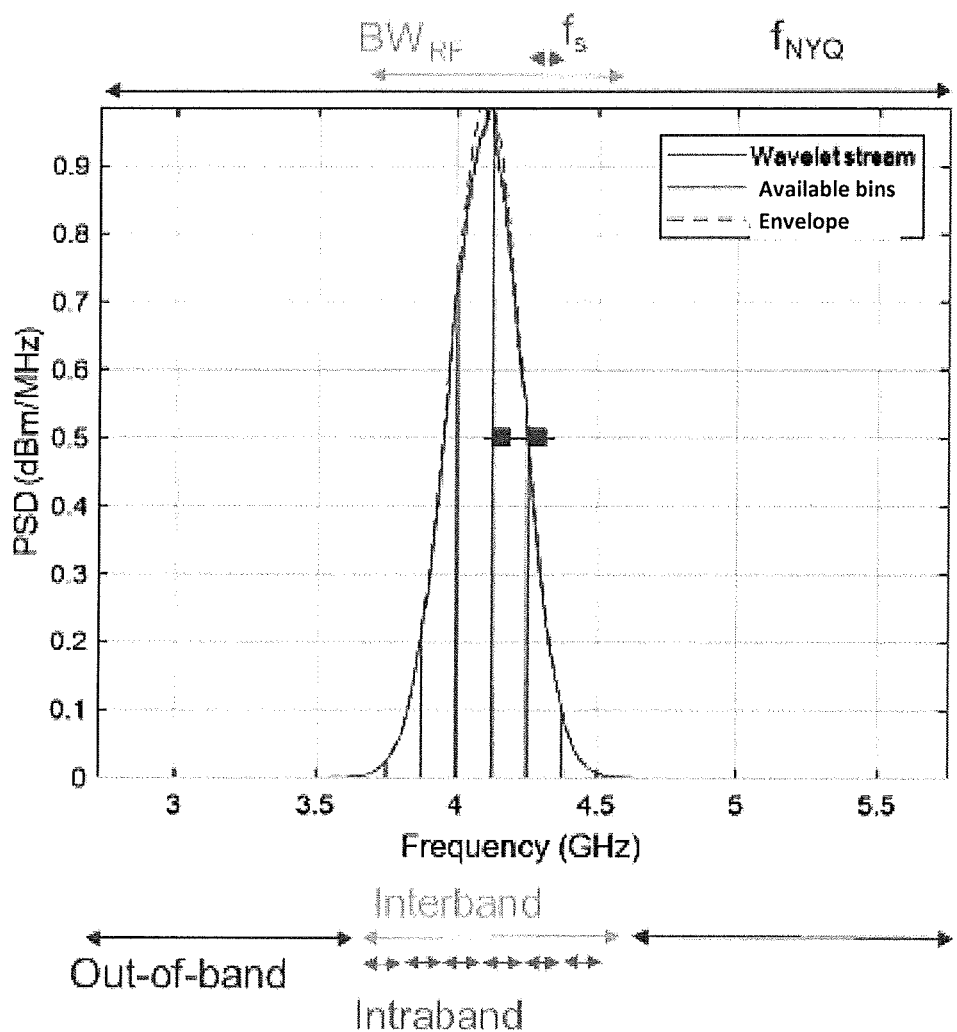
FIG. 2 represents the spectrum of the sequence of wavelets used in the sampler of FIG. 1 in the case of uniform sampling (UWBS)

A WBS (wavelet bandpass sampling) sampler, of uniform or non-uniform type, will be considered hereafter. It will be recalled that the wavelets used by this sampler are elementary functions of which the temporal support is bound and of which the central frequency is adjustable, these functions forming a base or even an overcomplete set of $L^2(\mathbb{R})$. We will also assume, with the aim of illustration and without loss of generality, that the wavelets in question are Gabor functions, such as defined above. Alternatively, they could be for example Morlet wavelets or even Haar wavelets. The input signal is correlated with a sequence of wavelets succeeding each other at the rate $f_p$ and the correlation results thereby obtained for the different wavelets are sampled at a sampling frequency $f_s$ which may be equal to $f_p$ (uniform sampling) or instead be less than it (non-uniform sampling).

The basic idea of the present invention is to carry out a modulation of the temporal positions of the wavelets, also called PPM (Pulse Position Modulation) by means of a modulation sequence derived from a CAZAC (Constant Amplitude Zero Auto Correlation) sequence so as to break the phase coherence of the spectral rays of the signal formed by the sequence of wavelets, before aliasing of the spectrum due to sampling.

It will be recalled that a CAZAC sequence is characterised by the fact that all its elements are of same module and that its cyclic autocorrelation is a zero centred Dirac. In other words, the cyclic correlation of a CAZAC sequence with this same shifted sequence is zero except when this shift is itself zero in which case the result of the correlation is equal to 1.

More precisely, if one considers a given central frequency $f_v^c$ and a CAZAC sequence $\eta_1, \ldots, \eta_\Sigma$ (where $\eta_1, \ldots, \eta_\Sigma$ are complex values) the sequence of PPM modulation, $\varepsilon_1, \ldots, \varepsilon_\Sigma$, is obtained by means of:

$$\varepsilon_k = \frac{1}{2\pi f_v^c} \arg(\eta_k), k = 1, \ldots, \Sigma \quad (8)$$

If one considers now a sequence of wavelets $$p(t) = \sum_{k=1}^{\Sigma} \psi_{f_v^c, \delta_k}(t),$$

the sequence obtained after PPM modulation may be expressed by:

$$\tilde{p}(t) = \sum_{k=1}^{\Sigma} \psi_{f_v^c, \delta_k}(t - \varepsilon_k) \quad (9)$$

where $\psi_{f_v^c, \delta_k}(t) = \left(\frac{2}{\pi}\right)^{\frac{1}{4}} \frac{1}{\sqrt{\tau}} e^{2\pi i f_v^c (t - \delta_k)} e^{-\left(\frac{t - \delta_k}{\tau}\right)^2}$ in the case where Gabor functions are used.

The duration of the sequence $\tilde{p}(t)$ is of $T_{acq} = \Sigma T_p$ where $f_p = 1/T_p$ is the rate at which the wavelets succeed each other. The sequence $\tilde{p}(t)$ may itself be repeated at the rate $f_{acq} = 1/T_{acq}$.

If one assumes that the wavelets of the sequence are of same central frequency $f_v^c$ and noting $\psi(t)$ the common waveform c, that is to say $\psi_{f_v^c, \delta_k}(t) = \psi(t - \delta_k)$, the sequence of wavelets after PPM modulation is written:

$$\tilde{p}(t) = \sum_{k=1}^{\Sigma} \psi(t - kT_p - \varepsilon_k) = \psi(t) \otimes \sum_{k=1}^{\Sigma} \delta(t - kT_p - \varepsilon_k) \quad (10)$$

where ⊗ represents the convolution product.

As an example of CAZAC sequences, Zadoff-Chu (ZC) sequences will advantageously be chosen, defined by:
$ZC_R(k) = e^{-j\pi R k(k-1)/\Sigma}$, if the length $\Sigma$ of the sequence is odd, and $ZC_R(k) = e^{-j\pi R(k-1)(k-1)/\Sigma}$, if the length $\Sigma$ of the sequence is even and where R,Σ being positive integers that are coprime (that is to say pgcd(R,Σ)=1), $-R/\Sigma$ being the slope of the instantaneous frequency along the sequence and $k \in [1, \Sigma]$.

If a ZC sequence of even length is chosen, the elements of the sequence may be written:

$$ZC_R(k) = e^{-j\pi R k^2 / \Sigma} = e^{j\varphi_R(k)} \quad (11)$$

with $\varphi_R(k) = -\frac{\pi R k^2}{\Sigma}$.

The ZC sequence may be considered as a chirp of which the instantaneous frequency takes the discrete values:

$$f_R = (k) = \frac{1}{2\pi} \frac{d\varphi_R(k)}{dk} = -\frac{R}{\Sigma} k \quad (12)$$

In the case of a ZC sequence, after PPM modulation of the sequence of wavelets the expression (10) then becomes:

$$\varepsilon_k = \frac{\varphi_R(k)}{2\pi f_v^c} = -\frac{R}{2\Sigma f_v^c} k^2 \quad (13)$$

By using a narrow band approximation of the wave function, $\psi(t)$, it will be understood that this PPM modulation is equivalent to a phase modulation of the wavelets using the continuous phase law, $\varphi_R(t)$, of period $T_{acq}=\Sigma T_p$, defined over $[0,T_{acq}]$ by:

$$\varphi_R(t) = -\frac{R\pi}{\Sigma T_p^2}t^2 = \pi\mu_R t^2 \text{ with } \mu_R = -\frac{R}{\Sigma T_p^2} = -\frac{Rf_p}{T_{acq}}. \quad (14)$$

The result is that the instantaneous frequency $$\frac{1}{2\pi}\cdot\frac{d\varphi_R}{dt}$$

undergoes a linear variation of slope $\mu_R$.

Figure 3A:
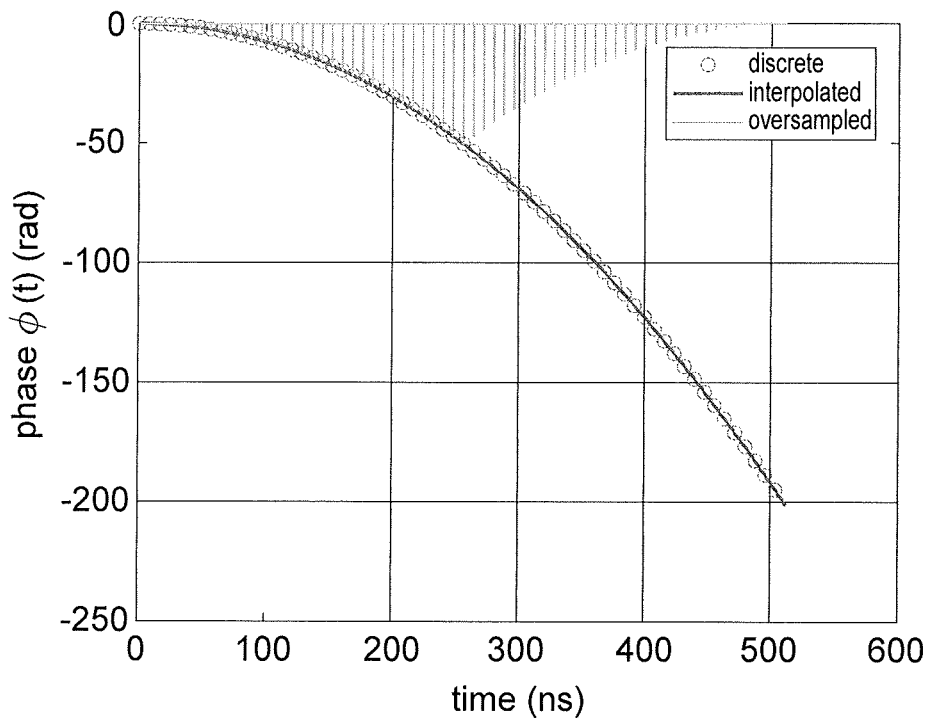
FIG. 3A and
FIG. 3B represent the evolution of the instantaneous phase, at each start of pulse, as well as the instantaneous frequency along a Zadoff-Chu sequence.
Figure 3B:
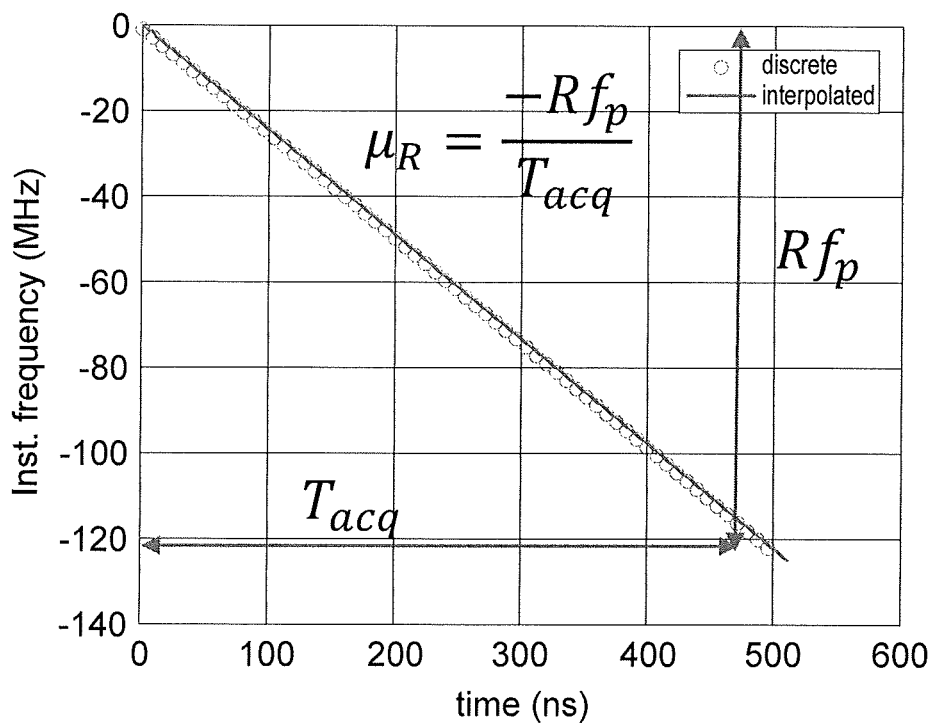

As an example, in FIGS. 3A and 3B are respectively represented the evolution of the phase and the instantaneous frequency along a Zadoff-Chu sequence. More precisely, the curves represented correspond to a sequence of length $\Sigma=64$, of root R=1 and a rate of $f_p=125$ MHz. It may notably be remarked that the instantaneous frequency varies linearly along the sequence, with a slope $\mu_R$.

Given the scale change properties of the Dirac function and the narrow band character of the spectrum of the wavelet, it is possible to show that:

$$\tilde{H}(f) \approx \Psi(f)\cdot 2\pi f_p FT\left(\sum_{k=1}^{\Sigma} e^{-ik\varphi(t)}\right) \quad (15)$$

where $\tilde{H}(f)$ and $\Psi(f)$ are respectively the spectra of $\tilde{p}(t)$ and $\psi(t)$, FT(.) signifies the Fourier transform and $\varphi(t)$ is a period phase law $T_{acq}$, verifying over $[0,T_{acq}]$ that $\varphi(kT_p)=\arg(\eta_k)=2\pi f_v^c \varepsilon_k$.

The expression (15) may be rewritten in the following form:

$$\tilde{H}(f) \approx \sum_{k=1}^{\Sigma} \tilde{H}_k(f-kf_p) \quad (16)$$

where $\tilde{H}_k(f)=2\pi f_p\psi(kf_p)FT(e^{-jk\varphi(t)})$ is the frequency response of a filter $\tilde{H}_k$ associated with the kth aliasing band. By comparing with the expression (6), it may be seen that the spectrum $\tilde{H}(f)$ is no longer a spectrum of lines but has elementary bands of width $f_p$. It may further be remarked that, compared to a conventional WBS sampler, the term $FT(e^{-ik\varphi(t)})$ introduces a phase modulation linked to the CAZAC sequence.

Figure 4B:
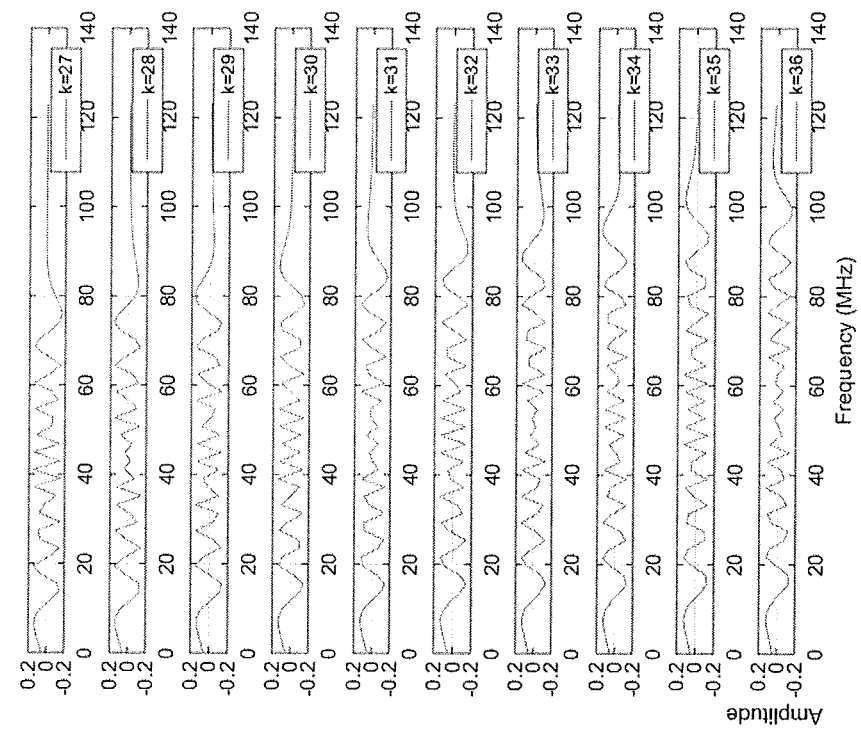
FIG. 4A and
FIG. 4B represent respectively phase components and frequency components of a sequence of wavelets temporal position modulated by a Zadoff-Chu sequence.
Figure 4A:
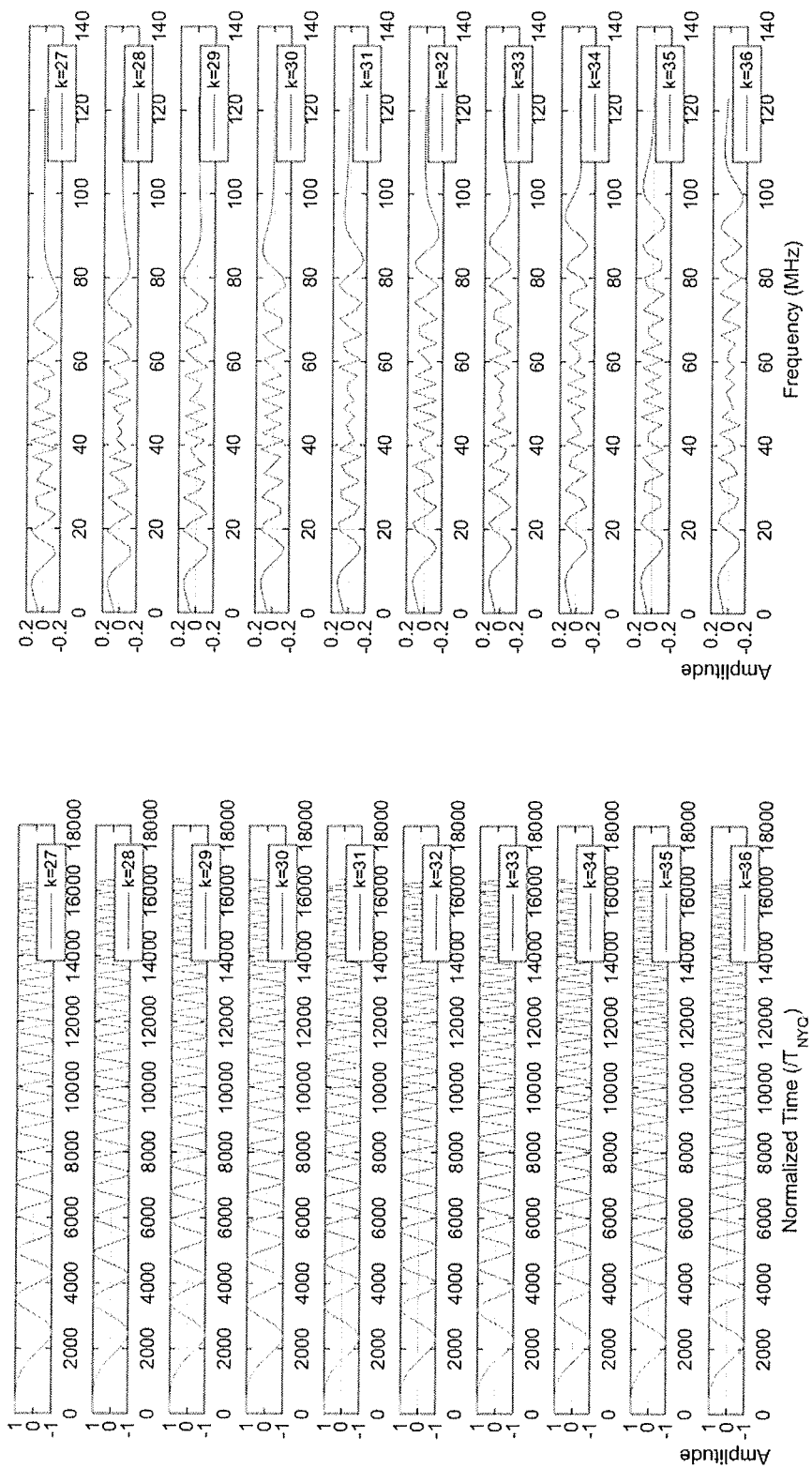

FIG. 4A represents the evolution of the real part of $\Re(e^{-ik\varphi(t)})$ over time, for different aliasing indices k and FIG. 4B represents the evolution of the real part $\Re(FT(e^{-ik\varphi(t)}))$ as a function of the frequency for these same indices.

This representation has been given as an example for a Zadoff-Chu sequence of length $\Sigma=64$ and of root r=1, a rate of $f_p=125$ MHz and a wavelet central frequency $f_v^c=4$ GHz.

FIGS. 4A and 4B are consistent with the fact that the Fourier transform of a Zadoff-Chu sequence is still a Zadoff-Chu sequence. The spectral band $\tilde{H}_k(f)$ appearing in the expression (16) is the result of a modulation (in the space of the frequencies) with a Zadoff-Chu sequence of root kR.

Given that two Zadoff-Chu sequences of same length and different roots (here kR, k'R with k≠k') have a low inter-correlation value (it is possible moreover to show that it is a minimum value for sequences having a perfect autocorrelation function), the different spectral bands are decorrelated.

In a more general manner, PPM modulation using a CAZAC sequence leads to a weak result of intercorrelation between two spectral bands, k'≠k (the intercorrelation between $\tilde{H}_k(f)$ and $\tilde{H}_{k'}(f)$ is weak except for k'=k).

The result is that, despite the aliasing of these different spectral bands in the base band $$\left[-\frac{f_p}{2}, +\frac{f_p}{2}\right]$$

on account of the bandpass sampling, it will be necessary to discriminate the original sub-bands and to recover the information of the signal by means of a suitable filtering.

Figure 5:
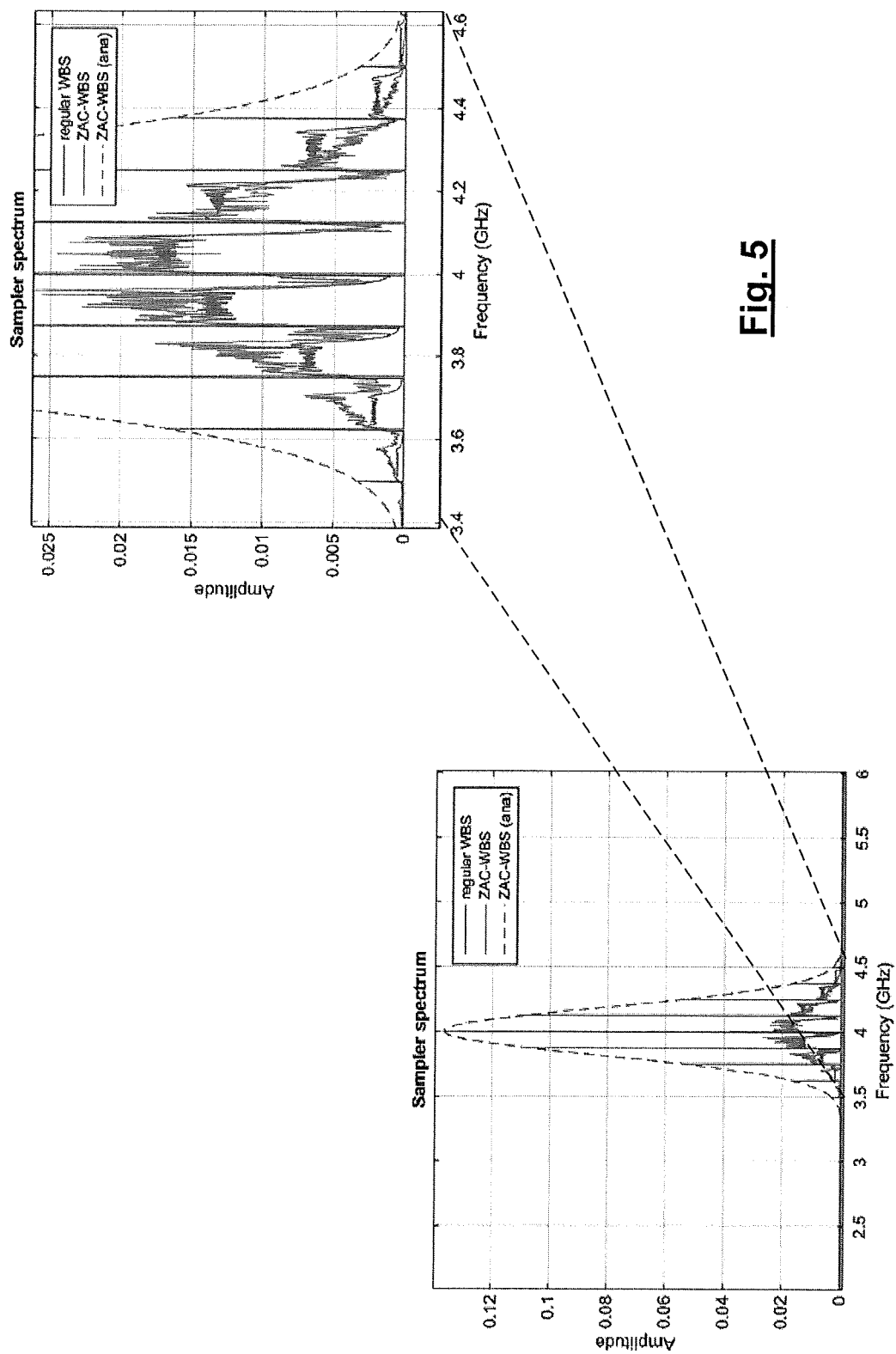
FIG. 5 represents the spectrum of a sequence of wavelets temporal position modulated by a Zadoff-Chu sequence.

FIG. 5 represents the spectrum of a sequence of wavelets position modulated by the Zadoff-Chu sequence illustrated previously.

As a comparison, the spectrum of the same sequence of wavelets, in the absence of modulation, is also shown.

One verifies that, for a spectrum of rays at intervals $f_p$, a continuous spectrum has been substituted of which the sub-band to sub-band intercorrelation properties are optimal. As mentioned previously, the rays of the spectrum of the non-modulated signal as well as the zeros of the modulated signal coincide with the multiples of the repetition frequency $f_p$.

Another manner of appreciating the decoherence between bands introduced by PPM modulation derived from a ZC sequence is to calculate the correlation between two columns of the measurement matrix.

If the same formalism as that used in equation 2 is again taken, the bandpass sub-sampling by sequence of wavelets (WBS) PPM modulated may be represented by:

$$y=R_T D\odot W^H F^{-1}s=R_T D\odot As \quad (17)$$

with $A=(FW)^H$, D the matrix of size $\Sigma\times N$ of which the elements are $D(k,n)=\exp(-j2\pi\varepsilon_k n\Delta f)$ where $\Delta f=1/T_{acq}$ and $\odot$ is the Hadamard product and $N=T_{acq}f_{Nyq}$.

The sensing matrix representing the bandpass sub-sampling by sequence of PPM modulated wavelets, designated hereafter $A_\Delta$WBS may thus be written:

$$A_\Delta = D\odot(FW)^H \quad (18)$$

Figure 6:
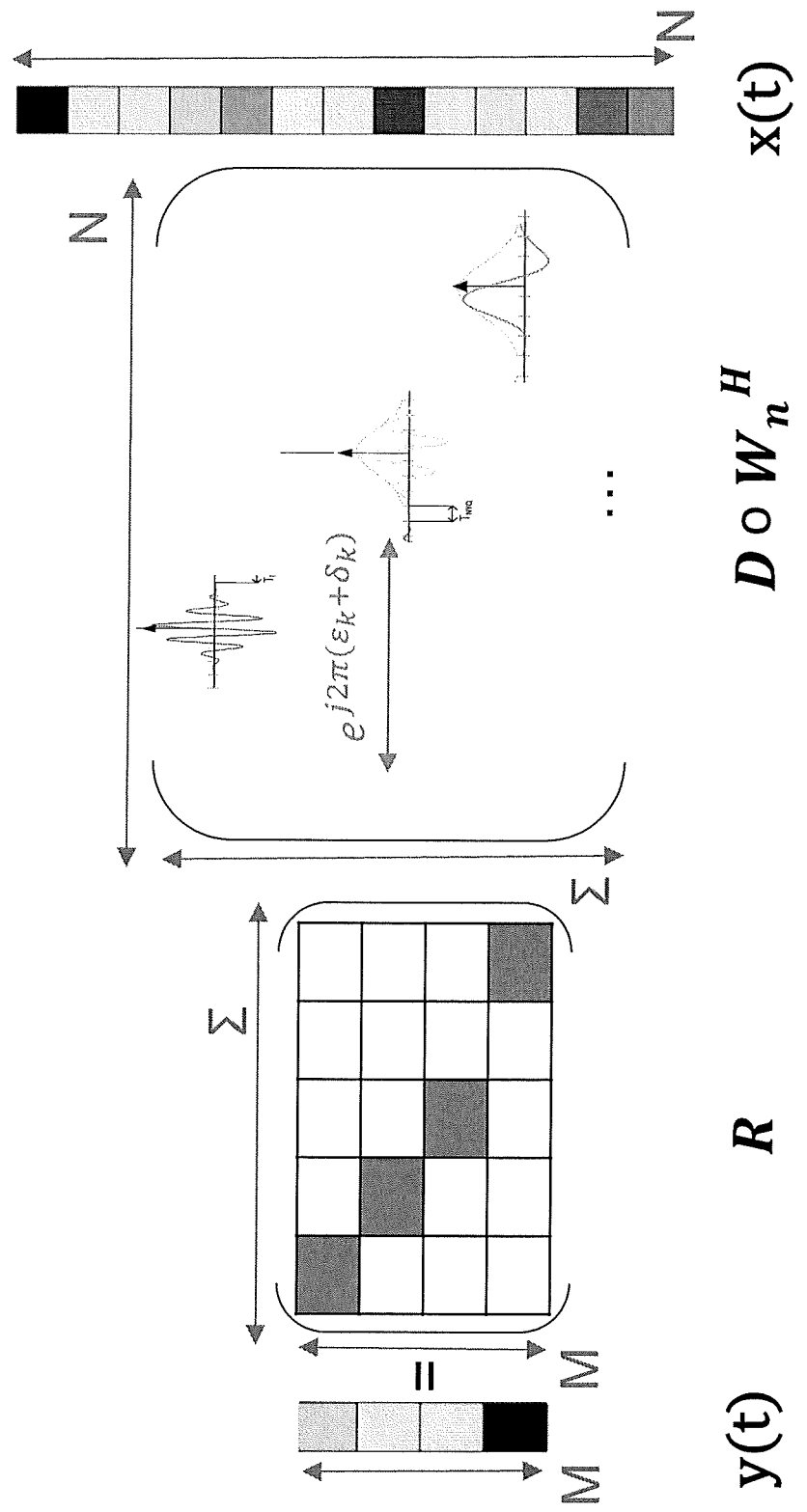
FIG. 6 schematically represents an example of sensing matrix used within the scope of a ΔWBS sampling method according to the present invention.

In FIG. 6 is represented the relationship (17) in the equivalent form $y=R_T D\odot W^H x$ where x is the vector of size N representative of the signal sampled at the Nyquist frequency.

The matrix $D\odot W^H$ contains on each line the samples (at the frequency $f_{Nyq}$) of a wavelet of frequency $f_v^c$ centred on the time $\delta_k+\varepsilon_k$. The matrix $R_T$ represents the selection of M samples among $\Sigma$ correlation results (in the case of a non-uniform sampling or NU-$\Delta$WBS) in the time interval $T_{acq}$.

In the case where the CAZAC sequence used for the PPM modulation is a ZC sequence, the elements of the matrix $A_\Delta^{norm}$ obtained by normalising the vector columns of the matrix $A_\Delta$ in such a way as to avoid the need for the amplitude of the wavelet (Gaussian term in the case of Gabor wavelets), may be written in the form:

$$A_\Delta^{norm}(k,n) = \exp(-j2\pi(\delta_k+\varepsilon_k)n\Delta f) = \exp\left(-j2\pi\left(\frac{k}{f_p}-\frac{Rk^2}{2f_v^c\Sigma}\right)n\Delta f\right) \quad (19)$$

If one chooses $\Delta f=1/T_{acq}$, the correlation between two components of the signal separated by $f_p=\Sigma \cdot \Delta f$, in other words between two columns of the matrix $A_\Lambda^{norm}$ separated by $\Sigma$ may be expressed in the form:

$$\Gamma_{n,n+\Sigma} = \sum_{k=1}^{\Sigma} \exp\left[j2\pi\left(\frac{Rk^2}{2\Sigma f_v^c}\right)f_p\right] = \sum_{k=1}^{\Sigma} \exp\left[j2\pi\left(\frac{Rk^2}{2}\right)\frac{\Delta f}{f_v^c}\right] \quad (20)$$

It may be seen that the correlation result is no longer periodic in $f_p$ as in the non-modulated case (corresponding to $R=0$, $\Gamma_{n,n=\Sigma}=\Sigma$) but is a sum of complex terms on the unit circle of which the module is weak.

Figure 7:
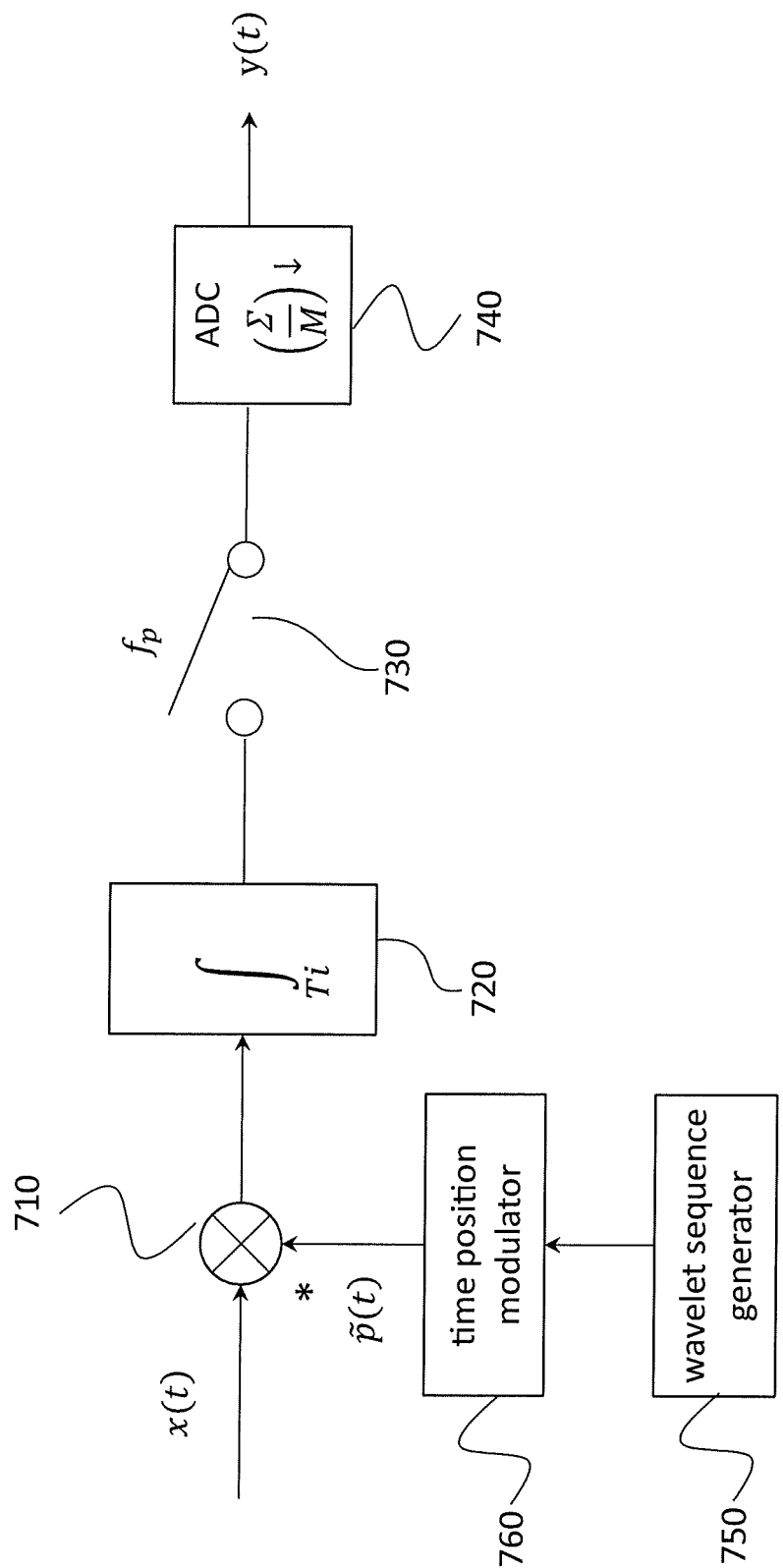
FIG. 7 schematically represents a ΔWBS sampler according to a first embodiment of the present invention.

FIG. 7 schematically represents a $\Delta$WBS sampler according to a first embodiment of the present invention.

This first embodiment corresponds to a series configuration, that is to say to a single sampling branch. In other words, the different sub-bands of the input signal are sampled sequentially.

The input signal, x(t), is firstly multiplied (Hermitian product) thanks to the mixer 710 with a sequence of wavelets position modulated by a CAZAC sequence such as a ZC sequence. Obviously, instead of carrying out a Hermitian product in the mixer 710, one could simply generate conjugated wavelets and carry out a conventional multiplication in the mixer 710.

The wavelet sequence generator 750 supplies a base sequence of duration $T_{acq}$, repeating every $T_{acq}$. The base sequence comprises $\Sigma$ wavelets succeeding each other at the rate $f_p$, where $\Sigma$ is the length of the CAZAC sequence. The period of the sequence of wavelets, designated sensing period, is thus $T_{acq}=\Sigma T_p$. The frequency $f_p$ is chosen equal to the bandpass sub-sampling frequency, that is to say to $$\sum_{i=1}^{N_b} B_i^w$$

where $B_i^w$, $i=1, \ldots, N_b$ are the widths of the sub-bands of the input signal.

The positions of the wavelets in the sequence of wavelets are modulated by the time modulator 760. More precisely, the $\Sigma$ wavelets of a base sequence are position modulated around the times $\delta_k=kT_p$ with $$\varepsilon_k = \frac{\arg(\eta_k)}{2\pi f_v^c}$$

where $\eta_k$, $k=1, \ldots, \Sigma$ are the elements of the CAZAC sequence.

The Hermitian product at the output of the mixer is integrated by the integrator 720 over a time interval corresponding to the temporal support of the wavefunction. The correlation results at the output of the integrator succeed each other at the rate $f_p$. These correlation results are sampled in 730 with a frequency $f_p$.

The sequence of samples is, if needs be, decimated in a non-uniform manner, and the samples thereby obtained are next digitally converted in the ADC converter 640. For example, all the samples of the sequence could be conserved ($f_s=f_p$) or instead only M samples among $\Sigma$ could be retained over a sensing period $T_{acq}$ (one then has $f_s \leq f_p$), which corresponds to a decimation factor $\Sigma/M$.

It should be noted that all of the elements 710-630, 750, 760 operate on analogue signals. The generator and the modulator could further be realised by a same analogue circuit as described hereafter. Thus, the $\Delta$WBS sampler is not subjected to the passband/sampling rate constraints inherent in samplers at the Nyquist frequency.

Figure 8:
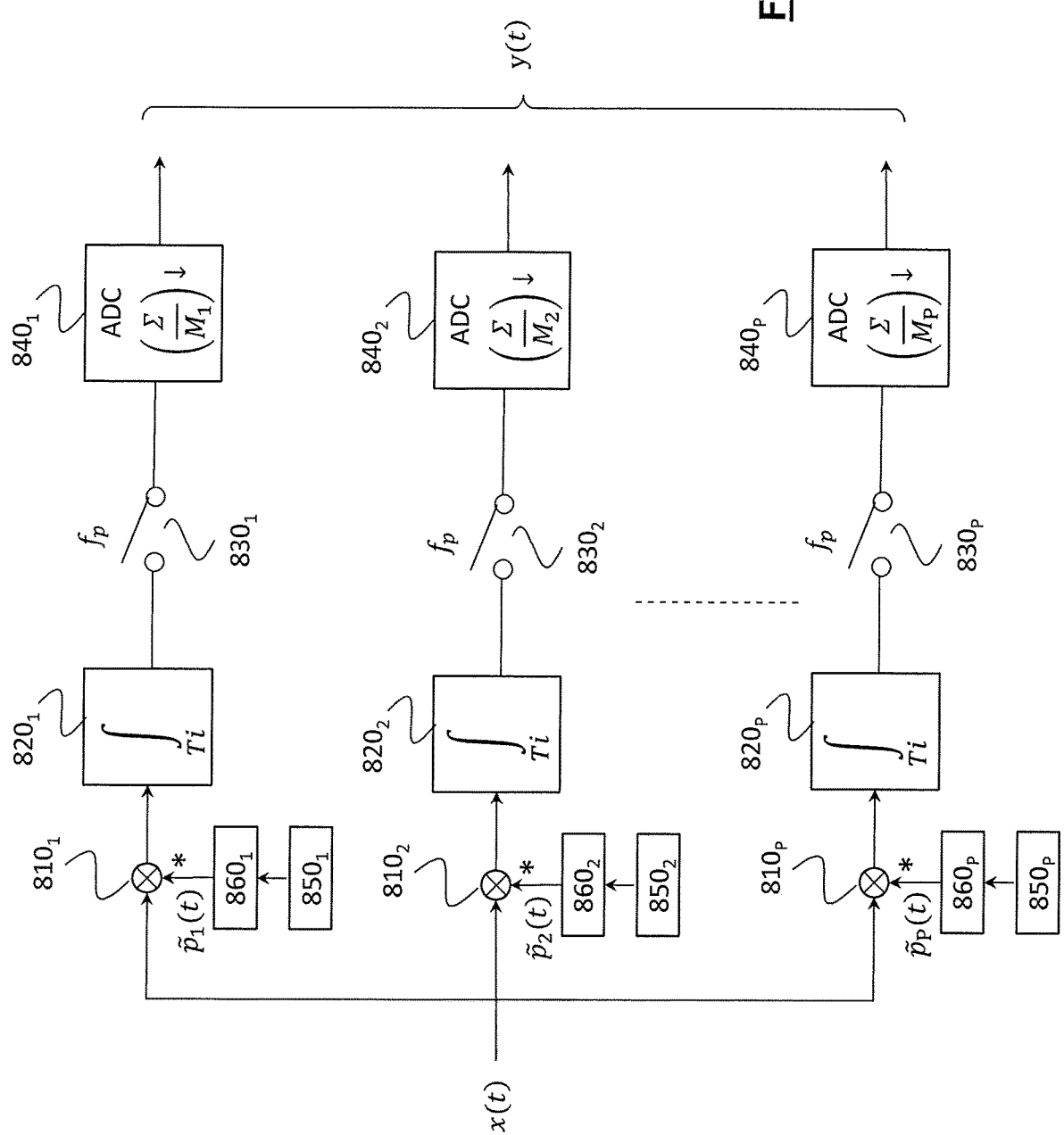
FIG. 8 schematically represents a ΔWBS sampler according to a second embodiment of the present invention.

FIG. 8 schematically represents a $\Delta$WBS sampler according to a second embodiment of the present invention.

This second embodiment corresponds to a configuration with a plurality P of sampling branches operating in parallel.

For example, each sampling branch may correspond to a band of the input signal. In other words, the different sub-bands of the input signal are then sampled in parallel and the sampling within a band is carried out sequentially.

Generally speaking, the different branches may correspond to different CAZACs with sensing periods $T_{acq}^i$, identical or distinct. For example, the CAZAC sequences of the different branches may be ZC sequences of same length $\Sigma$ but with different indexes R thus excursions of frequency $Rf_p$ that are different over a same sensing period $T_{acq}$. Preferably, ZC sequences will be used with indexes R that are coprime. The fact of using distinct CAZAC sequences (for example of distinct index) makes it possible to improve the diversity of the correlation results and leads to better rejection of aliasing.

The input signal x(t) is distributed over a plurality P of sampling branches in parallel, each branch P having the same structure as that represented in FIG. 7, namely comprising a wavelet sequence generator 850$_p$, a temporal position modulator 860$_p$, a mixer 810$_p$, an integrator 820$_p$, a sampler at the frequency $f_s$, 830$_p$, and an analogue digital converter, 840$_p$.

As in the first embodiment, the sampling may be uniform or non-uniform.

Whatever the embodiment, the signal at the output of the $\Delta$WBS sampler, noted y(t), makes it possible to reconstruct the input signal, x(t). To do so, the signal y(t) is firstly the subject of a transform into z:

$$Y_d(z) = \sum_{n=0}^{+\infty} y(n)z^{-n} \quad (21)$$

with $y(n)=y(nT_p)$, it being understood that in the case of non-uniform sampling with $$f_s = \frac{M}{\Sigma} f_p$$

the missing samples are replaced by zeros.

The result $Y_d(z)$ is next correlated with the responses of the filters $\tilde{H}_k$, in other words is the subject of a suitable filtering with these filters in the frequency domain. The spectra obtained, i.e.

$$\Lambda_k(f) = [Y_d(z) * H_k(z)]_{z=e^{j2\pi f_p}}$$

(where * represents the correlation) are next frequency transposed then summated to obtain the spectrum of bands:

$$\Lambda(f) = \sum_{k=0}^{K-1} \Lambda_k(f) \text{ where } \kappa = \frac{f_{Nyq}}{f_p}. \quad (22)$$

The spectrum $\Lambda(f)$ is that of a signal stemming from a conventional WBS sampling, the signal x(t) then being able to be deduced therefrom as described in the aforesaid patent EP-A-3319236.

Figure 9:
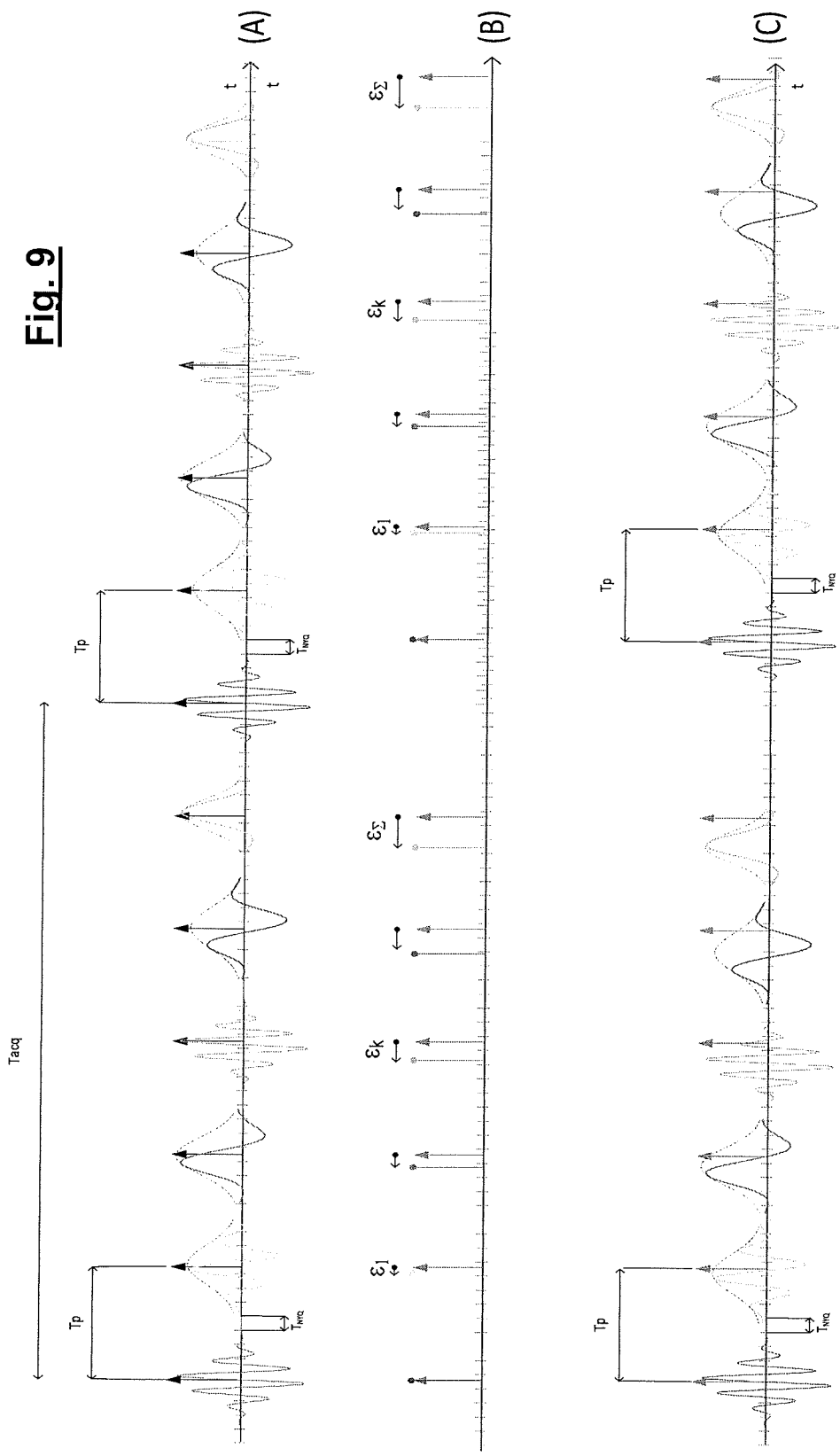
FIG. 9 represents an example of sequence of wavelets position modulated by a CAZAC sequence.

FIG. 9 represents an example of sequence of wavelets position modulated by a CAZAC sequence, such as used in the sampler of FIG. 7 or in a sampling branch of FIG. 8.

As indicated previously, the sequence of wavelets has a period $T_{acq}=\Sigma T_p$. The line (A) represents the non-modulated sequence, such as supplied by the generator 710 or one of the generators $850_p$. The line (B) represents the time shifts, $\Sigma_k$ stemming from the CAZAC sequence $\eta_k$, k=1, ..., $\Sigma$. Finally, the line (C) shows the sequence of wavelets position modulated by the time shifts stemming from the CAZAC sequence. The wavelets are henceforth centred on the instants $kT_p+\varepsilon_k$.

Figure 10:
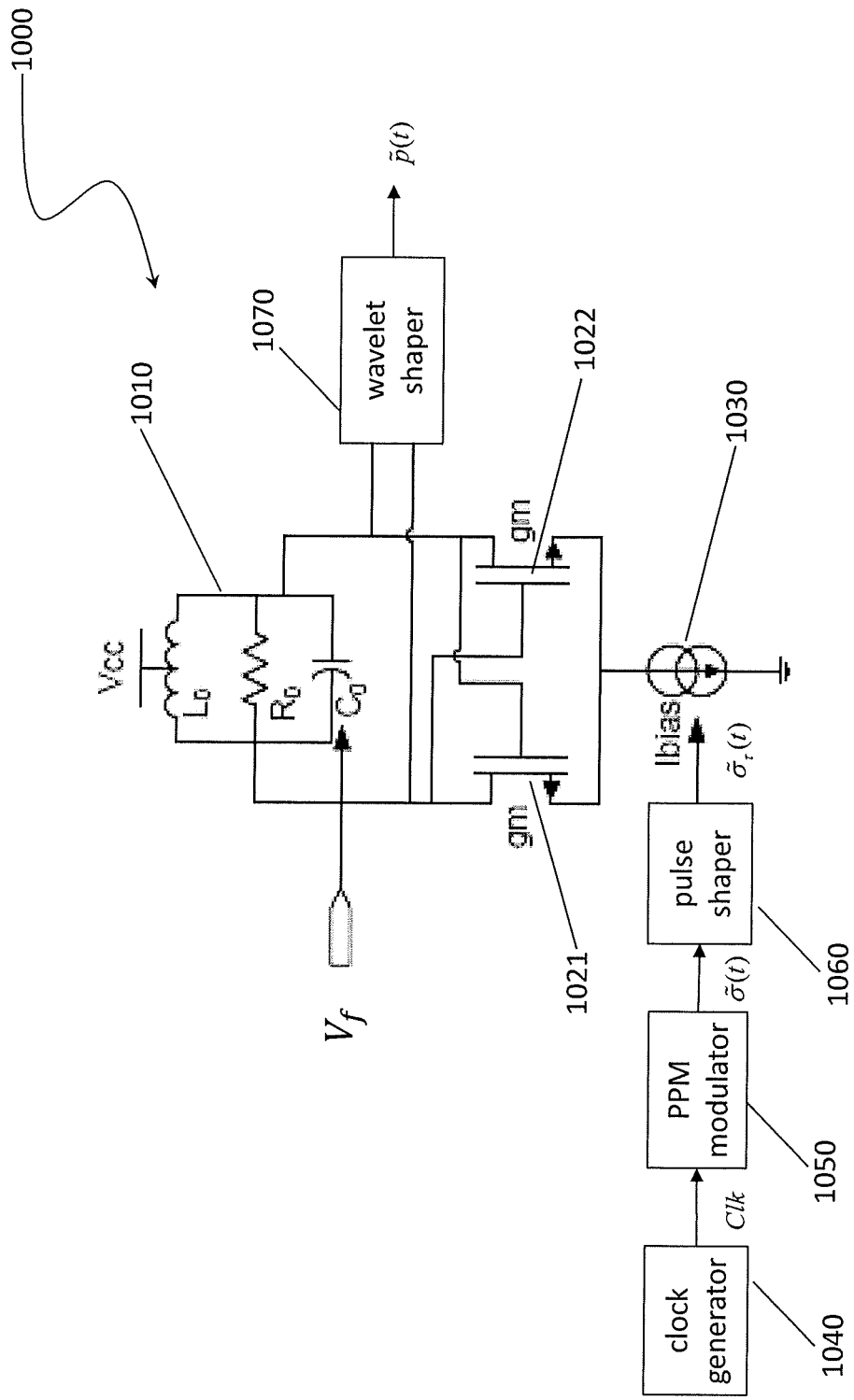
FIG. 10 schematically represents a wavelet sequence generator PPM modulated by means of a Zadoff-Chu sequence for the AWBS sampler of FIG. 7 or FIG. 8.
Figure 11:
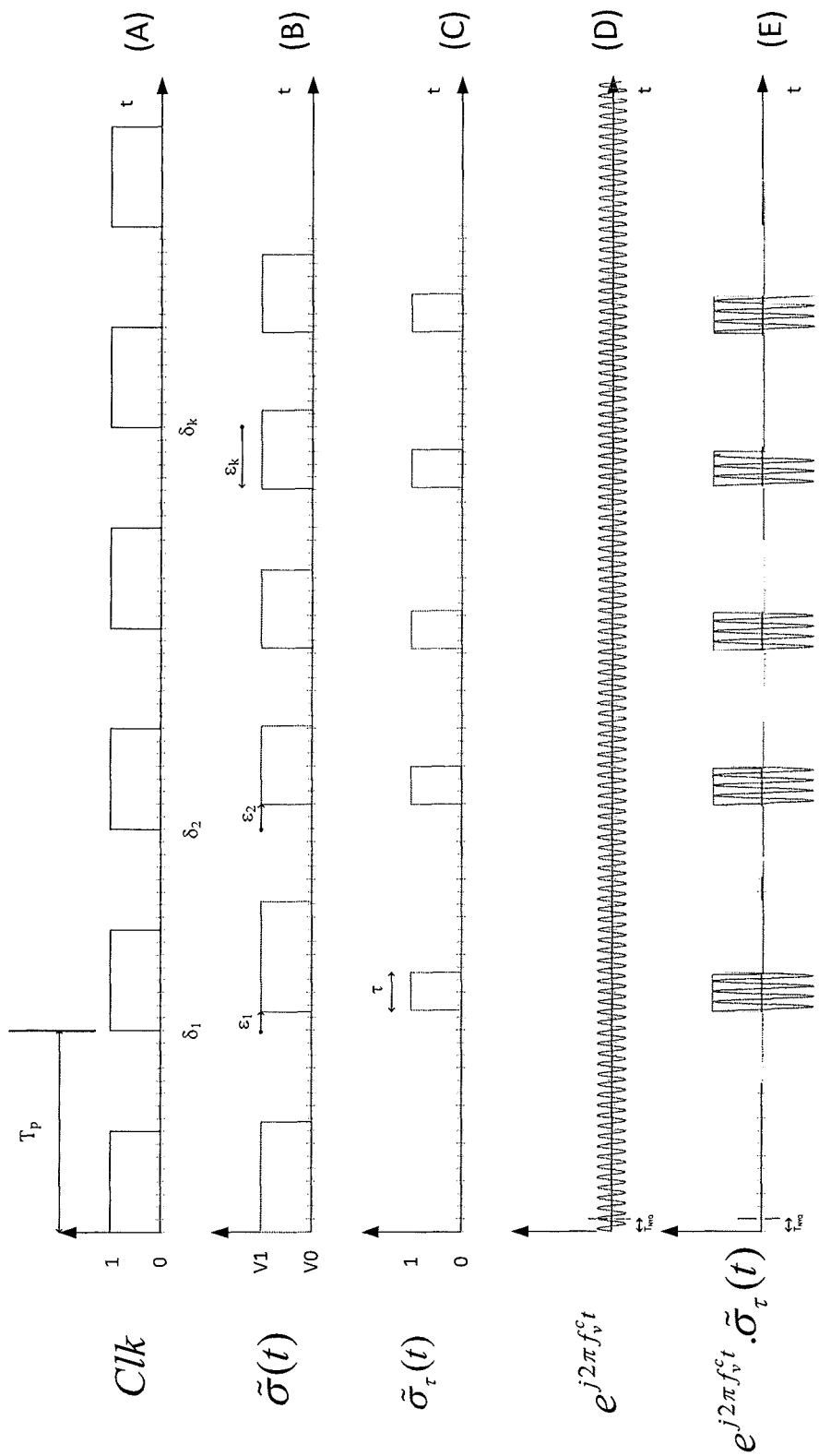
FIG. 11 represents signals at different points of the generator of FIG. 10.

FIG. 10 schematically represents a wavelet sequence generator PPM modulated for the $\Delta$WBS sampler of FIG. 8 or FIG. 9.

This wavelet sequence generator is particularly advantageous in so far as it combines the function of generation of wavelets and that of temporal position modulation.

The generator 1000 is based on a VCO oscillator switched to the repetition frequency $f_p$. The oscillator includes an oscillating circuit LC, 1010, using a Varicap controlled by a voltage $V_f$ so as to be able to control the oscillation frequency of the oscillating circuit. The voltage $V_f$ is chosen equal in such a way that the oscillating circuit oscillates at the central frequency of the wavelets, $f_v^c$. The voltage $V_f$ may thus vary at each new period $T_p$. The generator further includes in a conventional manner a pair of crossed transistors, 1021, 1022, mounted between the terminals of the oscillating circuit LC and a common current source, 1030. The current source is switched using a switching signal, $\tilde{\sigma}_\tau(t)$, obtained by modulating the temporal positions of the rise edges of a clock Clk at the frequency $f_p$.

The clock Clk has low phase jitter. It may be generated by means of the clock circuit 1040, directly by a quartz resonator, or even by a VCO oscillator locked by means of a phase locking loop on a low frequency signal, stable in frequency and in phase. The frequency of the clock signal is modulated by the frequency modulation circuit, 1050. Said circuit periodically modulates the frequency of the clock according to a linear law of slope $\mu_R$ over the duration $T_{acq}$ of the base sequence. In other words, the instantaneous frequency of the clock thereby modulated travels over an excursion of $Rf_p$ over the duration $T_{acq}=\Sigma T_p$. The clock signal thereby frequency modulated, $\tilde{\sigma}(t)$, is digitally shaped in a pulse shaping module, 960. This shaping module restricts the duration of the clock pulses to the duration $\tau$. The signal thereby shaped is used as switching signal $\tilde{\sigma}_\tau(t)$ of the current source.

The initial phase and the polarity of the initial pulse generated by the generator 900 are set by forcing the oscillating circuit to start in one direction. This may be done by introducing an unbalance between the 2 branches, for example by providing MOS transistors having different geometric ratios or instead by adding a capacitive charge in one of the branches.

The signal at the output of the switched oscillator is next filtered by an analogue shaping filter, 970, in such a way that each train of sinusoidal oscillations has the envelope of the wavefunction. Alternatively, the form of the wavefunction may be imposed in a digital manner by modulating the amplitude of the signal $\tilde{\sigma}(t)$ in the shaping module 960.

Two generators 900 could be provided, operating with clock signals Clk in quadrature so as to be able to have available signals of complex wavelets and to carry out the Hermitian product in the input mixer. The quadrature clock could be inversed so as to obtain simply the conjugated signals and use a conventional mixer on the paths I and Q.

FIG. 10 gives as illustrative example a chronogram of the signals at the different points of the wavelet sequence generator of FIG. 9.

Line (A) represents the clock signal Clk generated by the clock circuit 950. Line (B) represents the clock switching signal $\sigma(t)$, at the output of the frequency modulation circuit. It may be remarked that the rise edges of the switching clock are shifted by $\varepsilon_k$ with respect to the rise edges of the clock Clk. Line (C) represents the switching signal $\sigma_\tau(t)$ obtained by digital shaping of the clock switching signal by reducing the clock pulses to the width $\tau$ of the wavelet. At line (D) is represented the signal at the output of the oscillator when it is not switched (sinusoidal at the central frequency of the wavelet $f_v^c$). The signal at the output of the switched oscillator is represented at line (E): this is constituted of wave trains at the frequency $f_v^c$ starting at the instants $kT_p+\varepsilon_k$. This signal is shaped in the shaping filter 960 to supply the sequence of wavelets $\tilde{p}(t)$.

The invention claimed is:

1. A method for bandpass sampling of an analogue signal, the spectrum of said signal having a set of sub-bands, said signal being correlated with a sequence of wavelets succeeding each other with a rate $f_p$ equal to the sum of the widths of said sub-bands, the central frequencies of the wavelets belonging to said sub-bands, the method comprising:

temporally modulating the respective positions of the wavelets in the sequence by means of arguments of successive elements of a Constant Amplitude Zero AutoCorrelation waveform (CAZAC) sequence, the correlation results with the sequence of wavelets thereby position modulated being sampled with a frequency $f_s \leq f_p$ and digitally converted.

2. The bandpass sampling method according to claim 1, wherein the sequence of wavelets is formed of a plurality of base sequences, each base sequence being of duration $\Sigma T_p$ with $T_p=1/f_p$, the CAZAC sequence being of length $\Sigma$, where $\Sigma$ is a positive integer, the respective positions of the wavelets in a base sequence being temporally modulated by means of arguments of successive elements of the CAZAC sequence.

3. The bandpass sampling method according to claim 2, wherein the CAZAC sequence is formed by the complex elements $\eta_k$, k=1, ..., $\Sigma$ where the temporal positions of the wavelets of the sequence are the instants $kT_p+\varepsilon_k$ with $T_p=1/f_p$ and $$\varepsilon_k = \frac{\arg(\varepsilon_k)}{2\pi f_c^v},$$

where $f_c^v$ is the central frequency of the wavelets.

4. The bandpass sampling method according to claim 3, wherein the CAZAC sequence is a Zadoff-Chu sequence of which the elements are defined by:

$ZC_R(k)=e^{-j\pi Rk(k-1)/\Sigma}$, if the length $\Sigma$ of the sequence is odd, and $ZC_R(k)=e^{-j\pi Rk(k-1)(k-1)/\Sigma}$, if the length $\Sigma$ of the sequence is even and where R,$\Sigma$ are positive integers that are coprime, R representing the excursion of the instantaneous frequency, expressed as a multiple of $f_p$, along the sequence and $k \in [1,\Sigma]$.

5. The bandpass sampling method according to claim 4, wherein the sequence of wavelets is formed of at least a first and a second base sequence, the first base sequence being constituted of wavelets of which the positions are temporally modulated by means of arguments of successive elements of a first CAZAC sequence and the second base sequence being constituted of wavelets of which the positions are temporally modulated by means of arguments of successive elements of a second CAZAC sequence, the first and second CAZAC sequences being of same length but of distinct excursions of instantaneous frequency.

6. The bandpass sampling method according to claim 4, wherein the spectrum of the analogue signal includes a first and a second sub-band, and that the sequence of wavelets is formed of at least a first and a second base sequence, the first being constituted of wavelets of which the central frequency belongs to the first sub-band and the second being constituted of wavelets of which the central frequency belongs to the second sub-band.

7. The bandpass sampling method according to claim 1, wherein the wavelets are Gabor functions.

8. The bandpass sampling method according to claim 1, wherein the wavelets are Morlet wavelets.

9. A device for bandpass sampling of an analogue signal by bandpass sampling, the spectrum of said signal having a set of sub-bands, the device including at least one sampling branch comprising:

a wavelet sequence generator, the wavelets of said sequence succeeding each other with a rate $f_p$ equal to the sum of the widths of said sub-bands;

a correlator for correlating the analogue signal with said sequence of wavelets and supplying correlation results at the rate $f_p$;

a sampler for sampling the correlation results at the rate $f_p$;

an analogue digital converter for decimating and digitally converting the correlation results thereby sampled; and a temporal position modulator intended to modulate the temporal positions of the wavelets of the sequence of wavelets generated by the generator, before correlation with the analogue signal, the temporal modulation being carried out by means of arguments of successive elements of a Contact Amplitude Zero AutoCorrelation waveform (CAZAC) sequence.

10. The bandpass sampling device according to claim 9, wherein the CAZAC sequence is a Zadoff-Chu sequence of which the elements are defined by:

$ZC_R(k)=e^{-j\pi Rk(k-1)/\Sigma}$, if the length $\Sigma$ of the sequence is odd, and $ZC_R(k)=e^{-j\pi Rk(k-1)(k-1)/\Sigma}$, if the length $\Sigma$ of the sequence is even and where R,$\Sigma$ are positive integers that are coprime, R representing the excursion of the instantaneous frequency, expressed as a multiple of $f_p$, along the sequence and $k \in [1,\Sigma]$.

11. The bandpass sampling device according to claim 10, wherein the wavelet sequence generator includes a voltage controlled oscillator (VCO) switched by a switching signal, the VCO including:

an oscillating circuit, the frequency of which is controlled to be equal to the central frequency of the wavelets of the sequence;

a pair of crossed transistors, mounted between the terminals of the oscillating circuit;

a common current source, the current source being switched by the switching signal;

a clock generator, for generating a clock signal at the frequency $f_p$;

a frequency modulator, for linearly modulating the frequency of the clock signal in such a way that it varies linearly from the start to the end of the sequence of wavelets with an excursion of $Rf_p$.

12. The bandpass sampling device according to claim 10, wherein the wavelet sequence generator further includes a pulse shaping module, transforming each pulse of the clock signal into a pulse having the waveform of a wavelet.

13. The bandpass sampling device according to claim 9, wherein the wavelets are Gabor functions.

14. The bandpass sampling device according to claim 9, wherein the wavelets are Morlet wavelets.

* * * * *